United States Patent
Li et al.

(10) Patent No.: US 12,283,930 B2
(45) Date of Patent: Apr. 22, 2025

(54) SYSTEMS FOR AND METHODS OF WIDEBAND DISTRIBUTED AMPLIFICATION

(71) Applicant: AVAGO TECHNOLOGIES INTERNATIONAL SALES PTE. LIMITED, Singapore (SG)

(72) Inventors: Guansheng Li, Irvine, CA (US); Heng Zhang, Irvine, CA (US); Delong Cui, Irvine, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 469 days.

(21) Appl. No.: 17/716,181

(22) Filed: Apr. 8, 2022

(65) Prior Publication Data

US 2023/0327623 A1    Oct. 12, 2023

(51) Int. Cl.
*H03F 3/60* (2006.01)
*H03F 1/18* (2006.01)
*H03F 3/21* (2006.01)

(52) U.S. Cl.
CPC .............. *H03F 3/607* (2013.01); *H03F 1/18* (2013.01); *H03F 3/211* (2013.01); *H03F 2200/294* (2013.01); *H03F 2200/423* (2013.01)

(58) Field of Classification Search
CPC . H03F 3/607; H03F 1/18; H03F 3/211; H03F 2200/294; H03F 2200/423; H03F 2200/315; H03F 2200/543; H03F 3/213; H03F 3/245; H03F 2200/451; H03F 3/605; H03F 1/42
USPC ........................................................ 330/286
See application file for complete search history.

(56) References Cited

U.S. PATENT DOCUMENTS 8,665,022 B2 *   3/2014   Kobayashi .............. H03F 3/607
                                                    330/266

OTHER PUBLICATIONS

H. Kimura et al., "A 28 GB/s 560 mW Multi-Standard SerDes With Single-Stage Analog Front-End and 14-Tap Decision Feedback Equalizer in 28 nm CMOS," in IEEE Journal of Solid-State Circuits, vol. 49, No. 12, pp. 3091-3103, Dec. 2014, doi: 10.1109/JSSC.2014.2349974.

* cited by examiner

*Primary Examiner* — Andrea Lindgren Baltzell
*Assistant Examiner* — Jose E Pinero
(74) *Attorney, Agent, or Firm* — Foley & Lardner LLP

(57) ABSTRACT

Systems and methods are related to a distributed amplification. An amplification device can include cells including a first cell and a second cell and transmission lines including a first line and a second line. The first cell is coupled to the first line, and the second cell is coupled to the second line. The first line is configured to provide a first delay related to a delay between the first cell and the second cell. The device also includes a summer including a first input coupled to the first line and second input coupled to the second line. The summer is configured to provide an output signal.

20 Claims, 7 Drawing Sheets

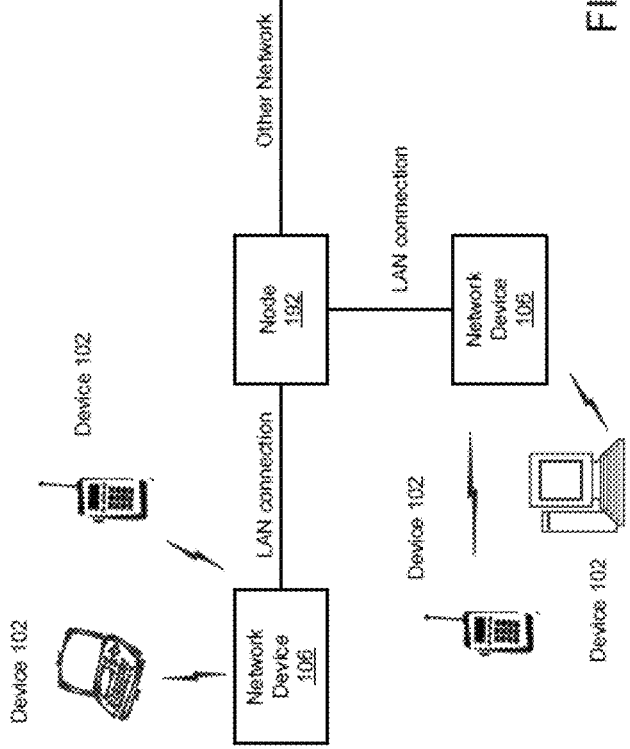

SYSTEMS FOR AND METHODS OF WIDEBAND DISTRIBUTED AMPLIFICATION

BACKGROUND

This disclosure generally relates to a communication system or data processing system, including but not limited to a communication or computing system including a transmitter, receiver or analog-to-digital converter (ADC).

Recent developments in communication and computing devices demand high data rates. For example, network switches, routers, hubs or any communication devices may exchange data at a high speed (e.g., 1 Megabits per second (Mbps) to 100 Gigabits per second (Gbps)) to stream data in real time or process a large amount of data in a seamless manner. High-speed data communication and processing systems, including but not limited to, analog-to-digital converters, serializer/deserializers (SERDES), Ethernet physical layers (PHY), and optical transceivers, often deliver high frequency signals. The high frequency signals are often amplified and/or buffered at the input and/or output stage. Multistage amplifiers have been employed to increase bandwidth in light of large load capacitances. However, some multistage amplifier schemes may have performance deficiencies at higher frequencies (e.g., frequencies above 50 Gigahertz (GHz)).

BRIEF DESCRIPTION OF THE DRAWINGS

Various objects, aspects, features, and advantages of the disclosure will become more apparent and better understood by referring to the detailed description taken in conjunction with the accompanying drawings. In the drawings, like reference numbers generally indicate identical, functionally similar, and/or structurally similar elements.

FIG. 1A is a general block diagram depicting a network environment including one or more access points in communication with one or more devices or stations according to one or more embodiments;

Figure 1B:
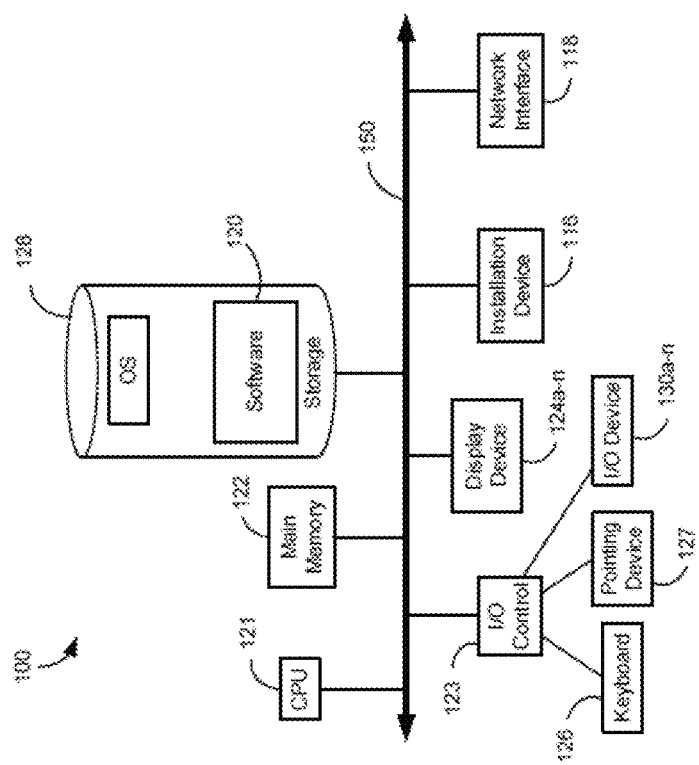
FIGS. 1B and 1C are general block diagrams depicting computing devices useful in connection with the methods and systems described herein according to one or more embodiments.

The details of various embodiments of the methods and systems are set forth in the accompanying drawings and the description below.

DETAILED DESCRIPTION

For purposes of reading the description of the various embodiments below, the following descriptions of the sections of the specification and their respective contents can be helpful:

Section A describes a network environment and computing environment which can be useful for practicing embodiments described herein; and Section B describes embodiments of systems for and methods of amplification, according to one or more embodiments.

Various embodiments disclosed herein are related to a distributed amplifier or distributed amplification. In some embodiments, a distributed amplifier operates at high frequencies (e.g., 50 GHz or greater) and overcomes bandwidth limitations associated with conventional architectures. In some embodiments, the distributed amplifier achieves both significant band extension (beyond 50 GHz) (e.g., at or above 65 GHz) and excellent return loss. In some embodiments, the distributed amplifier is employed in a 1 Terabit per second (Tb/s) or greater coherent optical transceiver, a 100 Gigabit per second (Gb/s) or greater Pulse Amplitude Modulation 4-level (PAM40) device, a 100 Gigabit per second (Gb/s) or greater SERDES, a 100 Gigabit per second (Gb/s) or greater PHY, and/or a 100 Gigabit per second (Gb/s) or greater switch integrated circuit (IC).

In some embodiments, a large amplifier is split into multiple smaller amplifiers or cells (e.g., two or more cells) so that their associated capacitance can be absorbed into an artificial transmission line or other circuit. In some embodiments, an input network including multiple $G_m$ cells can provide a large total $G_m$, where $G_m$ is transconductance or gain. In some embodiments, systems for and methods of distributed amplification align currents from $G_m$ cells in phase and sum the currents in a current summer. The current summer is coupled to multiple branches, each corresponding to a $G_m$ cell. Each branch includes an artificial transmission line or other circuit configured to align the current phases in some embodiments. In some embodiments, each branch is terminated in the current summer at a common gate transistor having a transconductance of $1/g_m$, where $1/g_m$ equals the characteristic impedance of the artificial transmission line, e.g., square root of $L_D/C_D$, where $L_D$ is inductance in the artificial transmission line and $C_D$ is capacitance in the artificial transmission line.

In some embodiments, common gate transistor transconductance of $1/g_m$ provides proper termination to the artificial transmission line on the source of the transistor (e.g., N-channel) and shows high output impedance on the drain of the transistor which is a beneficial characteristic of the current summer. In some embodiments, the currents are summed in phase, and pumped into a load resistor ($R_L$) and a load capacitor ($C_L$). In some embodiments, bandwidth extension techniques, such as shunt peaking and Tcoil peaking, are used to enhance bandwidth in an output network coupled to the summer.

Various embodiments disclosed herein are related to a device. The device includes cells including a first cell and a second cell and transmission lines including a first line and a second line. The first cell is coupled to the first line, and the second cell is coupled to the second line. The first line is configured to provide a first delay related to a delay between the first cell and the second cell. The device also includes a summer including a first input coupled to the first line and second input coupled to the second line. The summer is configured to provide an output signal.

In some embodiments, the first cell is configured to provide a first signal to the first line, and the second cell is configured to provide a second signal to the second line. In some embodiments, the output signal is a summed signal including a combination of the first signal and the second signal. In some embodiments, the summer includes a first transistor having a transconductance related to an inverse of inductance associated with the first line divided by capacitance associated with the first line. In some embodiments, the summer comprises a first transistor having a transconductance related to an inverse of a square root of inductance of the first line divided by capacitance of the first line. In some embodiments, the first line includes a network including a pair of capacitors coupled to ground and an inductor coupled between the pair of capacitors. In some embodiments, the first line includes a network including a pair of capacitors coupled to ground and an inductor coupled between the pair of capacitors, and the summer includes a first transistor having a transconductance related to an inverse of a square root of inductance of the inductor divided by capacitance of the pair of the capacitors.

In some embodiments, an output network is coupled to the summer. In some embodiments, the output network includes a network configured to perform inductive peaking.

Various embodiments disclosed herein are related to an amplifier in an integrated circuit. The amplifier includes a first network including a transmission line and a number of cells. Each of the cells has an input coupled to a node on the transmission line. The amplifier also includes circuits, and each of the circuits is coupled to a respective cell of the cells. At least one of the circuits includes a second network having inductance and capacitance. The amplifier also includes a summer coupled to the circuits. The summer is configured to provide an output signal and includes at least one transistor having a transconductance inversely related to a quotient of the inductance and the capacitance.

In some embodiments, the amplifier further includes an output network configured to receive the output signal from the summer. In some embodiments, the output network is configured to perform inductive peaking. In some embodiments, the first network is configured to provide a first delay related to a delay between the cells. In some embodiments, the transconductance of the transistor is inversely related to a square root of a quotient of the inductance and the capacitance. In some embodiments, one of the circuits is a direct connection between one of the cells and an input of the summer. In some embodiments, the summer comprises at least two transistors, and first inputs of the transistors are coupled to respective transmission circuits, second inputs of the transistors are coupled together, and gate inputs of the transistors are coupled together.

Various embodiments disclosed herein are related to a method of providing an output signal. The method includes providing a first signal at a first node on an input transmission line to a first cell, amplifying the first signal to provide a first amplified signal, providing a second signal at a second node on the input transmission line to a second cell, and amplifying the second signal to provide a second amplified signal. The second signal is delayed by a first delay with respect to the first signal. The method also includes delaying the first amplified signal with respect to the second amplified signal to compensate for the first delay, and summing the first amplified signal and the second amplified signal to provide the output signal.

In some embodiments, the summing uses a transistor having a transconductance related to a quotient of inductance of an inductor and capacitance of a capacitor used to delay the first signal. In some embodiments, the method also includes providing the output signal to an output network configured to perform series peaking, shunt-series peaking, or Tcoil peaking.

In some embodiments, the method also includes providing a third signal at a third node on the input transmission line to a third cell, the third signal being delayed by a second delay with respect to the first signal. In some embodiments, delaying the first amplified signal with respect to the second amplified signal includes delaying the second amplified signal and the first amplified signal to compensate for the second delay. In some embodiments, summing the first amplified signal and the second amplified signal includes summing the first amplified signal, the second amplified signal and a third amplified signal to provide the output signal.

A. Computing and Network Environment

Prior to discussing specific embodiments of the present solution, it can be helpful to describe aspects of the operating environment as well as associated system components (e.g., hardware elements) in connection with the methods and systems described herein. Referring to FIG. 1A, an embodiment of a network environment is depicted. In brief overview, the network environment includes a wireless communication system that includes one or more network devices 106 or access points (APs), one or more wireless communication devices 102 and a network hardware component or node 192. The wireless communication devices 102 can for example include laptop computers, tablets, personal computers, and/or cellular telephone devices. The details of an embodiment of each wireless communication device 102 and/or AP or network device 106 are described in greater detail with reference to FIGS. 1B and 1C. The network environment can be an ad hoc network environment, an infrastructure wireless network environment, a subnet environment, etc. in one embodiment. The network devices 106 or APs can be operably coupled to the network hardware or node 192 via local area network connections. The node 192, which can include a router, gateway, switch, bridge, modem, system controller, appliance, etc., can provide a local area network connection for the communication system. Each of the Network devices 106 or APs can have an associated antenna or an antenna array to communicate with the wireless communication devices in its area. The wireless communication devices 102 can register with a particular network device 106 or AP to receive services from the communication system (e.g., via a SU-MIMO or MU-MIMO configuration). For direct connections (e.g., point-to-point communications), some wireless communication devices can communicate directly via an allocated channel and communications protocol. Some of the wireless communication devices 102 can be mobile or relatively static with respect to network device 106 or AP.

In some embodiments, a network device 106 or AP includes a device or module (including a combination of hardware and software) that allows wireless communication devices 102 to connect to a wired network using wireless-fidelity (WiFi), or other standards. A network device 106 or AP can sometimes be referred to as a wireless access point (WAP). A network device 106 or AP can be implemented (e.g., configured, designed and/or built) for operating in a wireless local area network (WLAN). A network device 106 or AP can connect to a router (e.g., via a wired network) as a standalone device in some embodiments. In other embodiments, network device 106 or AP can be a component of a router. Network device 106 or AP can provide multiple devices access to a network. Network device 106 or AP can, for example, connect to a wired Ethernet connection and provide wireless connections using radio frequency links for other devices 102 to utilize that wired connection. A network device 106 or AP can be implemented to support a standard for sending and receiving data using one or more radio frequencies. Those standards, and the frequencies they use can be defined by the IEEE (e.g., IEEE 802.11 standards). A network device 106 or AP can be configured and/or used to support public Internet hotspots, and/or on a network to extend the network's Wi-Fi signal range.

In some embodiments, the network device 106 or AP can be used for (e.g., in-home or in-building) wireless networks (e.g., IEEE 802.11, Bluetooth, ZigBee, any other type of radio frequency based network protocol and/or variations thereof). Each of the wireless communication devices 102 can include a built-in radio and/or is coupled to a radio. Such wireless communication devices 102 and/or access points or network device(s) 106 can operate in accordance with the various aspects of the disclosure as presented herein to enhance performance, reduce costs and/or size, and/or enhance broadband applications. Each wireless communication device 102 can have the capacity to function as a client node seeking access to resources (e.g., data, and connection to networked nodes such as servers) via one or more network devices 106 or APs.

The network connections can include any type and/or form of network and can include any of the following: a point-to-point network, a broadcast network, a telecommunications network, a data communication network, a computer network. The topology of the network can be a bus, star, or ring network topology. The network can be of any such network topology as known to those ordinarily skilled in the art capable of supporting the operations described herein. In some embodiments, different types of data can be transmitted via different protocols. In other embodiments, the same types of data can be transmitted via different protocols.

Figure 1C:
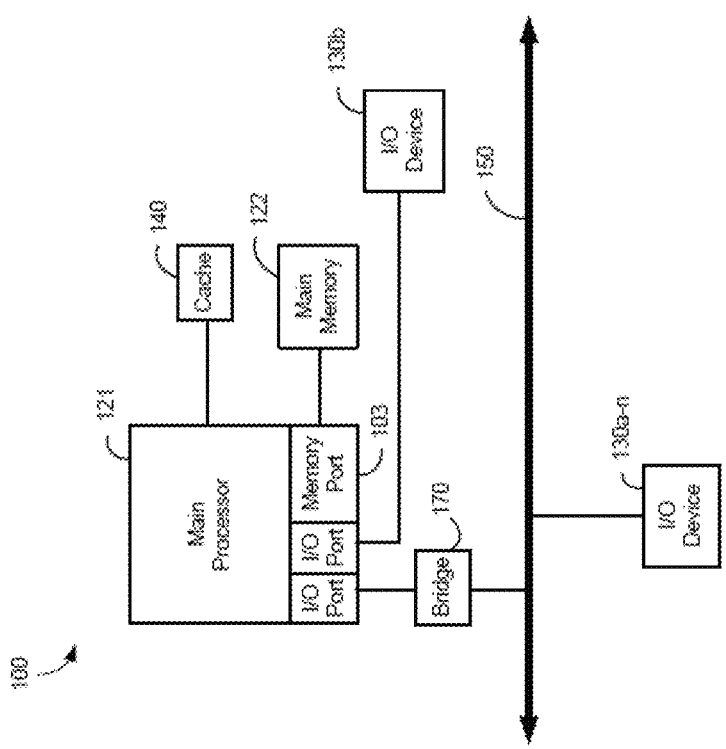

The communications device(s) 102 and access point(s) or network device(s) 106 can be deployed as and/or executed on any type and form of computing device, such as a computer, network device or appliance capable of communicating on any type and form of network and performing the operations described herein. FIGS. 1B and 1C depict block diagrams of a computing device 100 useful for practicing an embodiment of the wireless communication devices 102 or network device 106. As shown in FIGS. 1B and 1C, each computing device 100 includes a processor 121 (e.g., central processing unit), and a main memory unit 122. As shown in FIG. 1B, a computing device 100 can include a storage device 128, an installation device 116, a network interface 118, an I/O controller 123, display devices 124a-124n, a keyboard 126 and a pointing device 127, such as a mouse. The storage device 128 can include an operating system and/or software. As shown in FIG. 1C, each computing device 100 can also include additional optional elements, such as a memory port 103, a bridge 170, one or more input/output devices 130a-130n, and a cache memory 140 in communication with the central processing unit or processor 121.

The central processing unit or processor 121 is any logic circuitry that responds to and processes instructions fetched from the main memory unit 122. In many embodiments, the central processing unit or processor 121 is provided by a microprocessor unit, such as: those manufactured by Intel Corporation of Santa Clara, California; those manufactured by International Business Machines of White Plains, New York; or those manufactured by Advanced Micro Devices of Sunnyvale, California. The computing device 100 can be based on any of these processors, or any other processor capable of operating as described herein.

Main memory unit 122 can be one or more memory chips capable of storing data and allowing any storage location to be directly accessed by the microprocessor or processor, such as any type or variant of Static random access memory (SRAM), Dynamic random access memory (DRAM), Ferroelectric RAM (FRAM), NAND Flash, NOR Flash and Solid State Drives (SSD). The main memory 122 can be based on any of the above described memory chips, or any other available memory chips capable of operating as described herein. In the embodiment shown in FIG. 1B, the processor 121 communicates with main memory 122 via a system bus 150 (described in more detail below). FIG. 1C depicts an embodiment of a computing device 100 in which the processor communicates directly with main memory 122 via a memory port 103. For example, in FIG. 1C the main memory 122 can be a dynamic random access memory (DRAM).

FIG. 1C depicts an embodiment in which the main processor or processor 121 communicates directly with cache memory 140 via a secondary bus, sometimes referred to as a backside bus. In other embodiments, the main processor or processor 121 communicates with cache memory 140 using the system bus 150. Cache memory 140 typically has a faster response time than main memory 122 and is provided by, for example, SRAM, B SRAM, or EDRAM. In the embodiment shown in FIG. 1C, the processor 121 communicates with various I/O devices 130 via a local system bus 150. Various buses can be used to connect the central processing unit or processor 121 to any of the I/O devices 130, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 124, the processor 121 can use an Advanced Graphics Port (AGP) to communicate with the display 124. FIG. 1C depicts an embodiment of a computing device 100 in which the main processor or processor 121 can communicate directly with I/O device 130b, for example via HYPERTRANSPORT, RAPIDIO, or INFINIBAND communications technology. FIG. 1C also depicts an embodiment in which local busses and direct communication are mixed: the processor 121 communicates with I/O device 130a using a local interconnect bus while communicating with I/O device 130b directly.

A wide variety of I/O devices 130a-130n can be present in the computing device 100. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices can be controlled by an I/O controller 123 as shown in FIG. 1B. The I/O controller can control one or more I/O devices such as a keyboard 126 and a pointing device 127, e.g., a mouse or optical pen. Furthermore, an I/O device can also provide storage and/or an installation medium or device 116 for the computing device 100. In still other embodiments, the computing device 100 can provide USB connections (not shown) to receive handheld USB storage devices such as the USB Flash Drive line of devices manufactured by Twintech Industry, Inc. of Los Alamitos, California.

Referring again to FIG. 1B, the computing device 100 can support any suitable installation device 116, such as a disk drive, a CD-ROM drive, a CD-R/ROW drive, a DVD-ROM drive, a flash memory drive, tape drives of various formats, USB device, hard-drive, a network interface, or any other device suitable for installing software and programs. The computing device 100 can further include a storage device, such as one or more hard disk drives or redundant arrays of independent disks, for storing an operating system and other related software, and for storing application software programs such as any program or software 120 for implementing (e.g., configured and/or designed for) the systems and methods described herein. Optionally, any of the installation devices 116 could also be used as the storage device. Additionally, the operating system and the software can be run from a bootable medium.

Furthermore, the computing device 100 can include a network interface 118 to interface to a network through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the computing device 100 communicates with other computing devices 100' via any type and/or form of gateway or tunneling protocol such as Secure Socket Layer (SSL) or Transport Layer Security (TLS). The network interface 118 can include a built-in network adapter, network interface card, PCMCIA network card, card bus network adapter, wireless network adapter, USB network adapter, modem or any other device suitable for interfacing the computing device 100 to any type of network capable of communication and performing the operations described herein.

In some embodiments, the computing device 100 can include or be connected to one or more display devices 124a-124n. As such, any of the I/O devices 130a-130n and/or the I/O controller 123 can include any type and/or form of suitable hardware, software, or combination of hardware and software to support, enable or provide for the connection and use of the display device(s) 124a-124n by the computing device 100. For example, the computing device 100 can include any type and/or form of video adapter, video card, driver, and/or library to interface, communicate, connect or otherwise use the display device(s) 124a-124n. In one embodiment, a video adapter can include multiple connectors to interface to the display device(s) 124a-124n. In other embodiments, the computing device 100 can include multiple video adapters, with each video adapter connected to the display device(s) 124a-124n. In some embodiments, any portion of the operating system of the computing device 100 can be configured for using multiple displays 124a-124n. In further embodiments, an I/O device 130 can be a bridge between the system bus 150 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a fiber optic bus, a Serial Attached small computer system interface bus, a USB connection, or a HDMI bus.

A computing device 100 of the sort depicted in FIGS. 1B and 1C can operate under the control of an operating system, which controls scheduling of tasks and access to system resources. The computing device 100 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7, 8 and 10, produced by Microsoft Corporation of Redmond, Washington; MAC OS, produced by Apple Computer of Cupertino, California; WebOS, produced by Research In Motion (RIM); OS/2, produced by International Business Machines of Armonk, New York; and Linux, a freely-available operating system distributed by Caldera Corp. of Salt Lake City, Utah, or any type and/or form of a Unix operating system, among others.

The computer system or device 100 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication. In some embodiments, the computing device 100 can have different processors, operating systems, and input devices consistent with the device. For example, in one embodiment, the computing device 100 is a smart phone, mobile device, tablet or personal digital assistant. Moreover, the computing device 100 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Aspects of the operating environments and components described above will become apparent in the context of the systems and methods disclosed herein.

B. Distributed Amplification System

Figure 2:
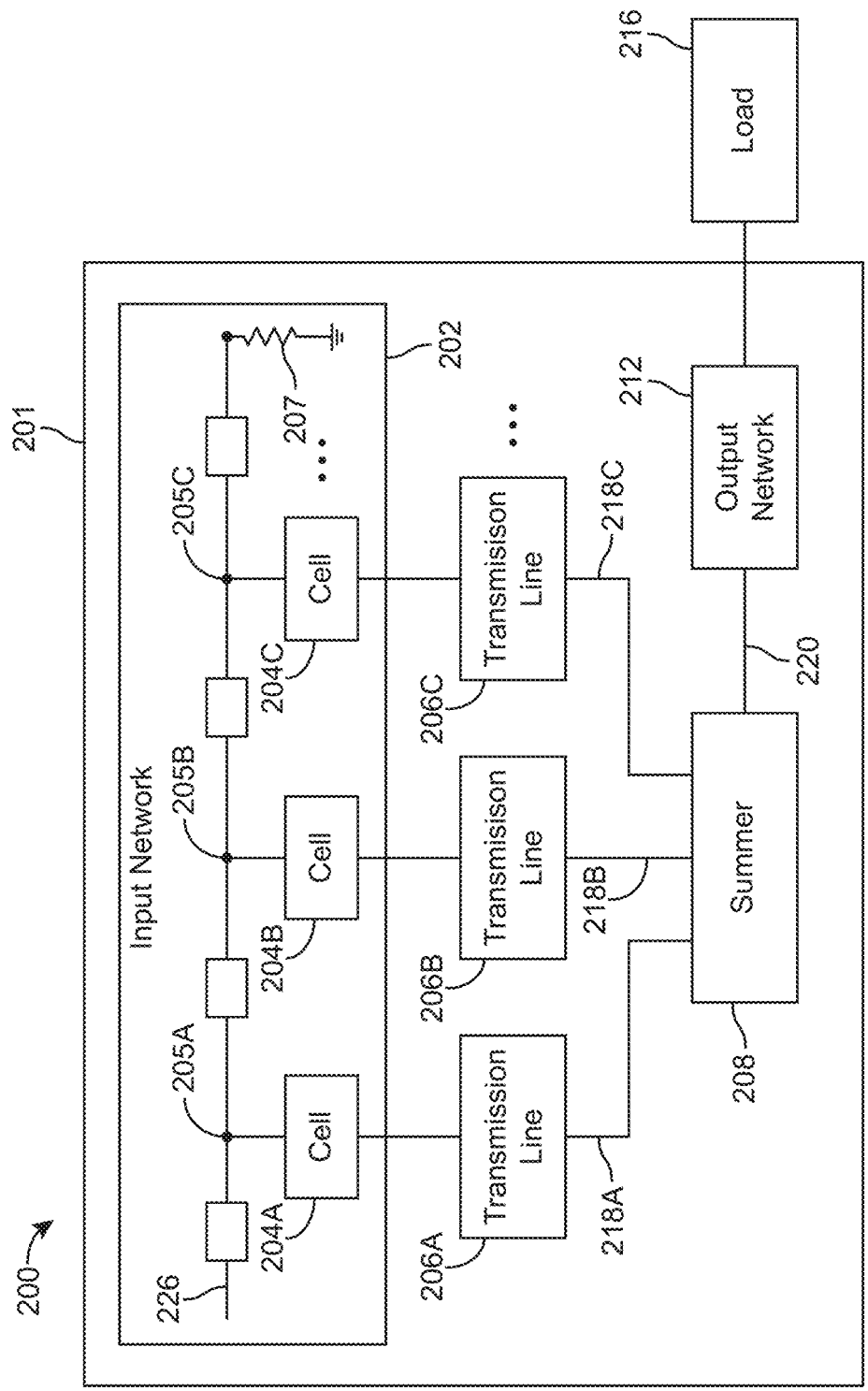
FIG. 2 is a general block diagram of a distributed amplifier according to one or more embodiments.

FIG. 2 is a block diagram depicting a communication device 200, according to one or more embodiments. In some embodiments, the communication device 200 is a system, a device, or an apparatus for network communications or computing and includes a distributed amplifier 201. For example, the communication device 200 may be implemented as part of network device 106, node 192 or network hardware, device 102, or network equipment serving a network in communication with device 102. In some embodiments, the device 200 is or includes an analog-to-digital converter, a serializer/deserializer (SERDES), an Ethernet physical layer (PHY), a Pulse Amplitude Modulation 4-level (PAM4) device and/or an optical transceiver and is configured for distributed amplification using distributed amplifier 201. Device 200 including distributed amplifier 201 can be fabricated in a CMOS process using CMOS components and be provided on an IC substrate in an IC package.

In some embodiments, distributed amplifier 201 includes an input network 202, transmission lines 206A-C (e.g., additional or artificial transmission lines), a summer 208, and an output network 212. The output network 212 drives a load 216 (e.g., a large loading capacitor) in some embodiments. These components may operate together to communicate with another communication device through a network cable (e.g., Ethernet, USB, Firewire, fiber optic cable, etc.) and/or through a wireless medium (e.g., Wi-Fi, Bluetooth, 60 GHz link, cellular network, etc.). In some embodiments, the communication device 200 includes more, fewer, or different components than shown in FIG. 2.

Input network 202 incudes cells 204A-C, transmission line or artificial transmission line 226, a termination resistor 207, and nodes 205A-C. Nodes 205A-C are locations on the transmission line 226 associated with respective inputs of cells 204A-C. Cells 204A-C can be any number of amplifiers or transconductance cells greater than 1 (e.g., 2, 3, 4, etc.). A corresponding number of transmission lines 206A-C are provided for the number of cells 204A-C. Summer 208 includes a number of inputs 218A-C corresponding to the number of transmission lines 206A-C. Summer 208 provides a single output 220 to output network 212.

Input transmission line or artificial transmission line 226 is coupled to cells 204A-C at various respective nodes 205A-C and is an IC trace conductor or metal layer inductor in some embodiments. The input transmission line or artificial transmission line 226 includes multiple sections, with an inductive element $L_G$ and capacitive element $C_G$ in each section. Elements $L_G$ and $C_G$ are designed such that the characteristic impedance $\sqrt{L_G/C_G}$ matches to termination resistor 207 at the end of line 226. The inductive and capacitive elements $L_G$ and $C_G$ can be capacitors and inductors or other circuit structures that have capacitance and inductance characteristics. The resistive elements can be resistors or other circuit structures that have resistance characteristics. For example, conductors or IC traces can have length, width, turns, and other material configured to provide a resistance, inductance or capacitance. The resistance, capacitance and inductance of such structures can be represented in FIG. 3 as discrete resistors, capacitors and inductors.

Cells 204A-C are configured as transconductance cells, each having a gain or transconductance contributing to a total transconductance of $G_m$. Input network 202 is configured to provide a large total $G_m$ using cells 204A-C in some embodiments. Cells 204A-C are configured as a high frequency voltage signal to current signal amplifiers in some embodiments. Cells 204A-C include one or more active devices, such as transistors, configured in an arrangement to provide a desired transconductance. Inputs to the cells 204A-C at respective nodes 205A-C have a time or phase delay of τ with respect to each other. For example, the signal at the input of cell 342A is delayed with respect to the input of cell 342B due to the inductance between the inputs (e.g., $L_G$). Artificial transmission line 226, cells 204A-C and transmission lines 206A-C are configured to align phases at inputs 218A-C, thereby compensating for the delay of τ. The currents from cells 204A-C are aligned in phase to obtain the largest output bandwidth in some embodiments. The currents from cells 204A-C are aligned to avoid currents cancelling each other at high frequency in some embodiments.

Transmission lines 206A-C each include inductive and capacitive elements configured to provide phase alignment at inputs 218A-C. The delay in each of transmission lines 206A-C matches the delay between inputs of cells 204A-C in some embodiments. In some embodiments, one of the transmission lines 206A-C is a direct connection; for example, transmission line 206C is a direct connection between cell 204C and input 218C. Transmission lines 206A-C are any circuits for connecting inputs 218A-C of summer 208 to cells 204A-C and can include conductors, resistive elements, capacitive elements, and inductive elements. Transmission lines 206A-C are configured as artificial transmission lines, buffers, delay paths, or circuit networks in some embodiments. The circuit networks can be embodied as IC circuit traces or metal layer conductors configured to have appropriate resistance, inductance and capacitance and/or can include discrete resistors, capacitors, or inductors. Respective transmission lines 206A-C can provide a phase delay τ to match the respective phase delay τ at nodes 205A-C associated with cells 204A-C. Artificial transmission lines 226 and 206 A-C are any circuit configured with inductance and capacitance (e.g. lumped elements such as lumped capacitors and inductors) in some embodiments.

Summer 208 is a component that receives the signals (e.g., amplified current signals) from transmission lines 206A-C and provides a combined signal at an output 220. The summer 208 can be any device for providing a summing operation and is a set of common-gate transistors (e.g., one for each input 218A-C) in some embodiments. The summer 208 is a current summer in some embodiments. The common-gate transistors have a transconductance of $1/g_m$ to provide matched termination to transmission lines 206A-C to prevent a reflection at $1/g_m$ that breaks phase alignment (e.g., independent impedance matching) in some embodiments. The term $1/g_m$ for each input 218A-C is equal to the characteristic impedance of artificial transmission lines 206A-C, i.e. square root of the inductance of the respective transmission line 206A-C divided by capacitance of the respective transmission line 206A-C (square root (inductance/capacitance)).

Output network 212 delivers the output current signal of summer 208 to the loading circuits or load 216. In some embodiments, load 216 is a large capacitor (e.g., 600 fF or greater). Output network 212 includes resistive, capacitive and inductive elements, and is configured to utilize inductive peaking techniques (e.g., series peaking, shunt-series peaking and/or Tcoil peaking) in some embodiments. Inductive peaking techniques improve bandwidth using resonance characteristics of an inductive-capacitive network in some embodiments. Shunt-series peaking is a passive filtering technique or a bandwidth extension technique using a shunting inductor (e.g., in which an inductor connected in series with the load resistor shunts an output capacitor) in some embodiments. Series peaking is a passive filtering technique or a bandwidth extension technique using a series coupled inductor (e.g., in which an inductor connected in series with an output capacitor) in some embodiments. Tcoil peaking is a passive filtering technique or a bandwidth extension technique which uses a coupled inductor (e.g., a transformer with three leads with one lead connected in series with a load resistor and with another lead coupled in series with a load capacitor) in some embodiments.

Figure 3:
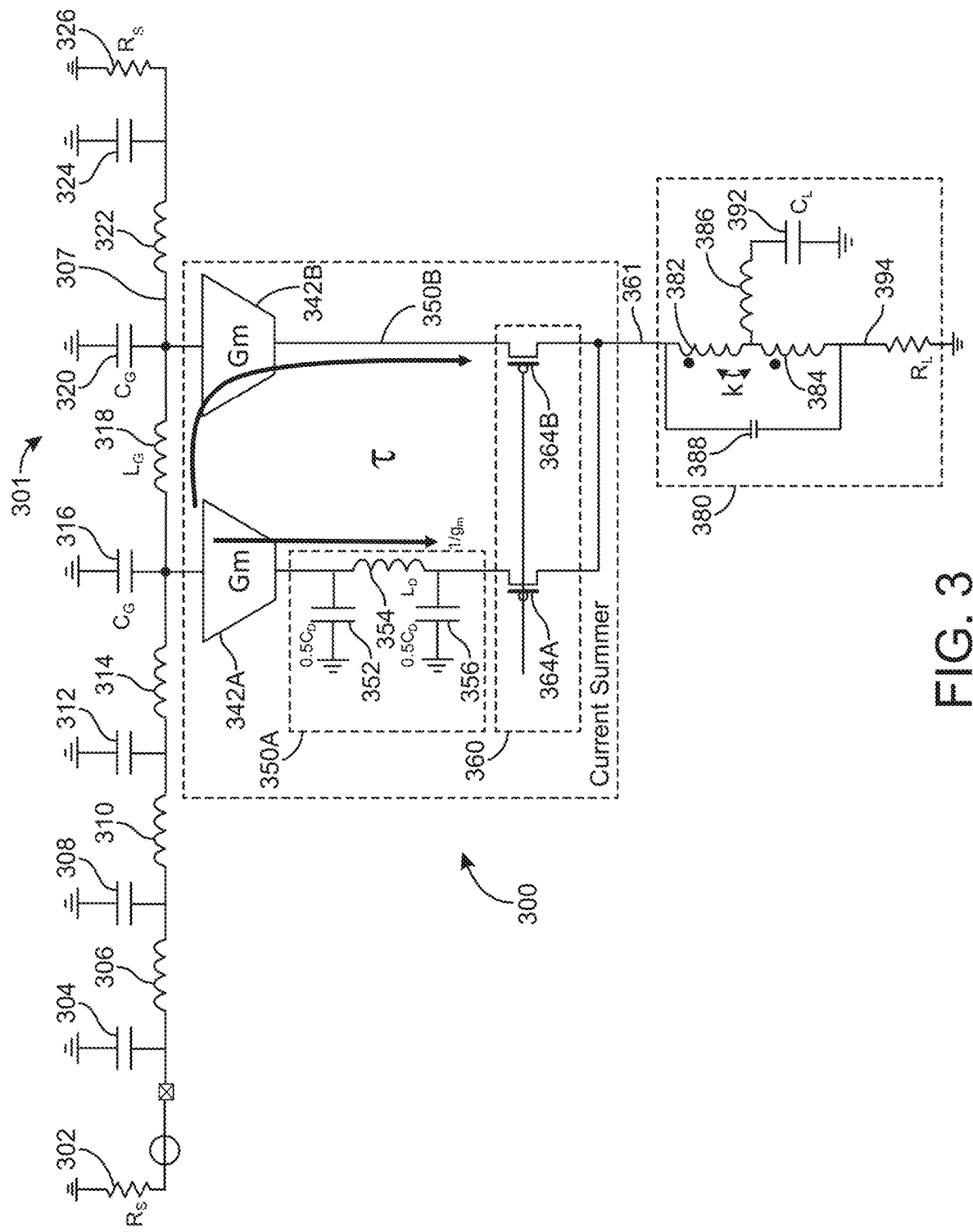
FIG. 3 is an electrical schematic drawing of a distributed amplifier according to one or more embodiments.

With reference to FIG. 3, distributed amplifier 300 can be used in device 200 (FIG. 2) and is similar to distributed amplifier 201. Distributed amplifier 300 includes an input network 301, transconductance cells 342A-B, transmission lines 350A-B (e.g., additional or artificial transmission lines, circuits, etc.), a summer 360, and an output network 380. Distributed amplifier 300 is described below as having two cells 342A-B and two transmission lines 350A-B. However, distributed amplifier 300 can employ more than two cells 342A-B and two transmission lines 350A-B depending on design criteria and system parameters. Cells 342A-B and transmission lines 350A-B can be any number of amplifiers greater than 1 (e.g., 2, 3, 4, etc.).

Input network 301 includes an input transmission line 307, a resistor 302 (e.g., representing signal source's output resistance $R_s$ (e.g., 50 ohms)), a capacitor 304 (e.g., representing pad capacitance), an inductor 306, a capacitor 308 (e.g., representing electrostatic discharge diode capacitance), a capacitor 312 (e.g., representing parasitic capacitance), an inductor 314, a capacitor 316 (e.g., representing gate capacitance $C_G$), an inductor 318 (e.g., representing gate inductance $L_G$), a capacitor 320 (e.g., representing gate capacitance $C_G$), a capacitor 324, and a resistor 326 (e.g., representing termination resistance that is equal to $R_s$). Cells 342A and 342B each have outputs coupled to respective transmission lines 350A and 350B. Cell 342A is coupled at a node between inductors 314 and 318, and cell 342B is coupled at a node between inductors 318 and 322. Capacitor 316 is coupled between an input of cell 342A and ground. Capacitor 320 is coupled between an input of cell 342B and ground. Cells 342A-B can be similar to the cells 204A-C (FIG. 2). Transconductance cells 342A-B can be part of input network 301.

A corresponding number of transmission lines 350A-B are provided for the number of cells 342A-B. Transmission lines 350A-B are similar to transmission lines 206A-C and can be any type of circuit for providing a connection between summer 360 and cells 342 A-B. In some embodiments, transmission line 350A is a circuit including a circuit network including a capacitor 352 (e.g., representing a capacitance of $0.5C_D$), an inductor 354 (e.g., representing an inductance of $L_D$), and capacitor 356 (e.g., representing a capacitance of $0.5C_D$), and transmission line 350B is a circuit (e.g., conductor) providing a direct connection to summer 360. The signal at the input of cell 342B is delayed with respect to the input of cell 342A due to at least in part to the inductor 313 (e.g. $L_G$) in some embodiments. Transmission lines 350A-B receive amplified signals from cells 342A-B and are configured to compensate for the delay.

Summer 360 can be a multi-transistor current summer. In some embodiments, summer 360 includes transistors 364A-B (e.g., cascoded NMOS transistors) with drains connected to node 361, sources coupled to respective transmission lines 350A-B, and gates coupled together and biased to a desired voltage. Transistors 364A-B are configured and driven to provide the appropriate gain or transconductance (e.g., $1/g_m$). Complimentary versions of transistors 364A-B can be implemented by replacing PMOS transistors with NMOS transistors and interchanging ground and VDD. The number of transistors 364A-B (e.g., in cascode) corresponds to the number of transmission lines 350A-B in some embodiments.

Summer 208 provides a single output 220 as a current signal to output network 380. The current signal is a combination of the amplified signals received at the sources of transistors 364A-B. Transistors 364A-B have a transconductance of $g_m$, where $1/g_m$=Square Root $(L_D/C_D)$ and $\tau$=Square Root $(L_D C_D) \ll 1/f_o$, where $f_o$ is the output frequency and where $R_s$=Square Root $(L_G/C_G)$ and $\tau$=Square Root $(L_G C_G) \ll 1/f_o$. Transmission line 350A provides the delay $\tau$ for phase alignment. $C_G$ is 90 fF, and $L_G$ is 150-170 picoHenries (pH) in some embodiments. $C_D$ is 35 fF, and $L_d$ is approximately 80 picoHenries (pH) in some embodiments. Transmission line 350B provides a direct connection to the source of transistor 364B (e.g., little or no delay).

Output network 380 includes an inductive-capacitive network of inductors 382, 384, and 386, a capacitor 388, a capacitor 392 and a resistor 394. Inductors 382, 384, and 386 are multiple core inductors in some embodiments. The capacitor 392 and a resistor 394 represent load capacitance ($C_L$) (e.g., 600 fF) and load resistance ($R_L$) (e.g., 12 ohm). Output network 380 is configured to drive a large loading capacitance (e.g., capacitor 392). Output network 380 is configured for Tcoil peaking in some embodiments. An output transmission line is coupled to output network 380 in some embodiments. Load resistor 394 and load capacitor 392 represent output transmission line resistance and capacitance in some embodiments. The various capacitors, resistors, and inductors shown in FIG. 3 can represent electrical characteristics of transmission lines and other circuit structures and are not necessarily discrete components.

Figure 4:
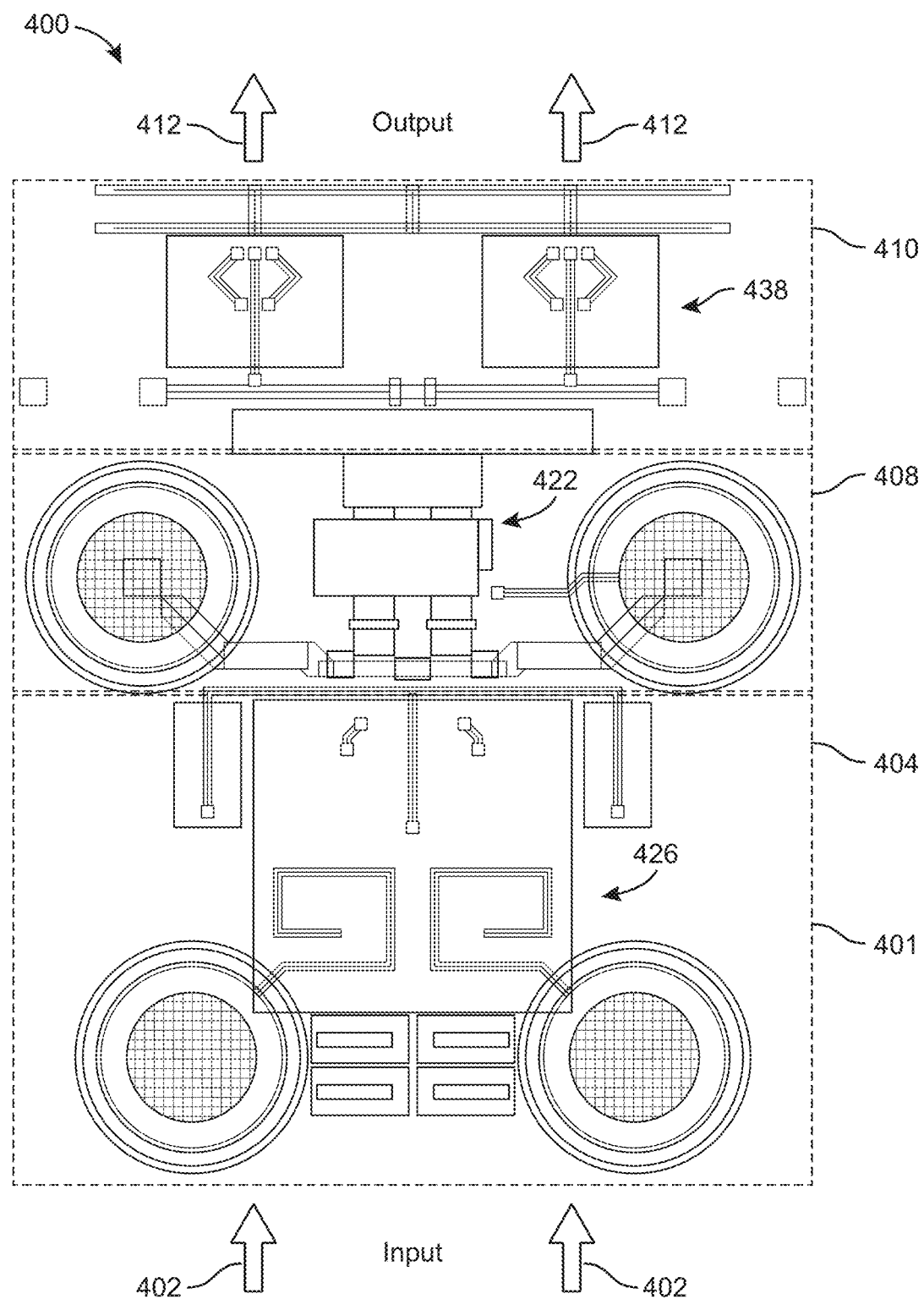
FIG. 4 is a planar top view schematic drawing of a distributed amplifier according to one or more embodiments.

With reference to FIG. 4, a distributed amplifier 400 can be part of a coherent optical transceiver operating at a 65 GHz bandwidth in some embodiments. Distributed amplifier 400 includes an input 402 and an output 412. Distributed amplifier 400 is provided on an integrated circuit (IC) substrate 401 for inclusion in an IC package. Distributed amplifier 400 includes a distributed input network 404 coupled to input 402, a current summer and phase alignment circuit 408, and an output network 410 coupled to output 412.

Distributed input network 404 can be similar to input network 301 (FIG. 3) and can include active elements such as transistors for amplification operations. Distributed input network 404 can include passive elements 426 on metal layers above the IC substrate 401 for input transmission line circuits. Current summer and phase alignment circuit 408 can be similar to transmission lines 350A-B and summer 360 (FIG. 3) and can include active elements such as transistors for current summing operations.

Current summer and phase alignment circuit 408 can include passive elements 422 on metal layers above the IC substrate 401 for artificial transmission line circuits. Phase alignment can be achieved using various circuit structures, including but not limited to transmission lines, artificial transmission lines and buffers.

Output network 410 is similar to output network 380 (FIG. 3) and is configured to provide inductive peaking in some embodiments. Output network 410 can include passive elements 438 provided on metal layers above the IC substrate 401. Output network 410 can be circuitry configured to receive a signal from current summer and phase alignment circuit 408 including but not limited to a passive circuit (e.g., a resistor-capacitor-inductive network, an inductive network, a resistive-inductive network, a resistive-capacitive network, and/or an inductive-capacitive network).

Figure 5:
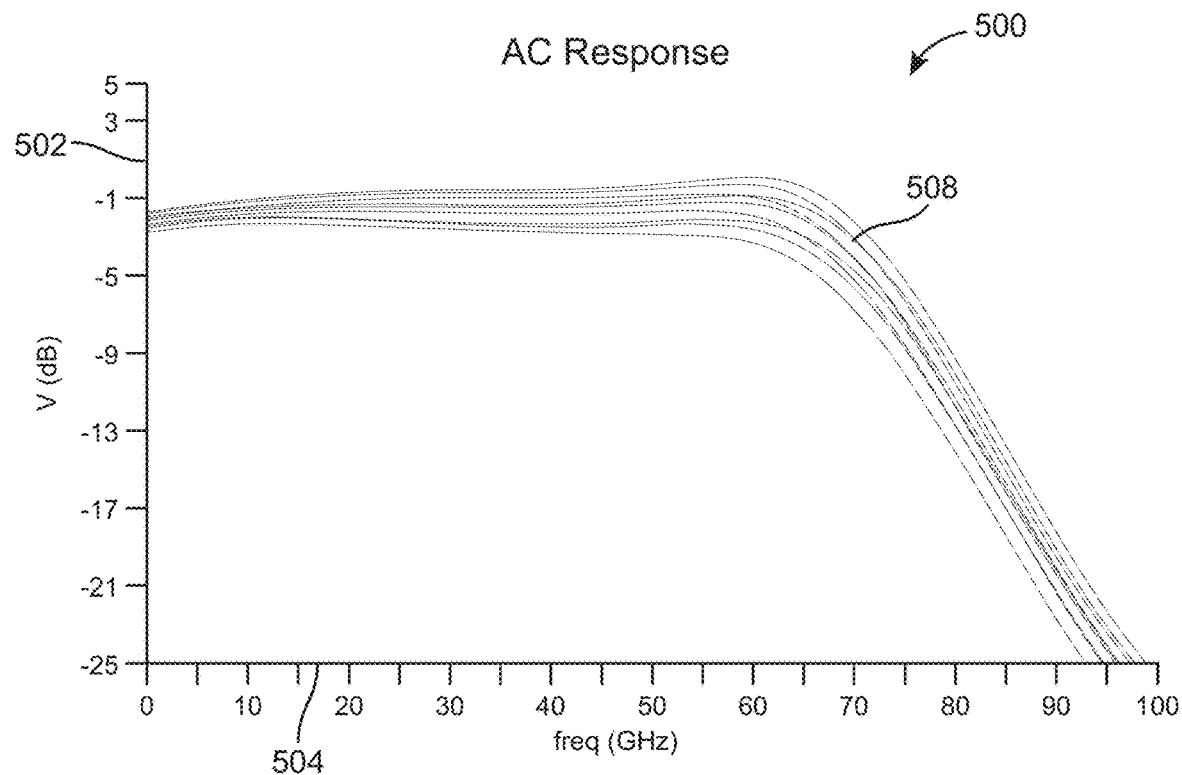
FIG. 5 is a graph showing voltage in dB versus frequency for an output signal of the distributed amplifier illustrated in FIG. 3 according to one or more embodiments.

With reference to FIG. 5, a graph 500 includes a Y-axis 502 representing voltage in dB and an X-axis 504 representing frequency. Graph 500 includes curves 508 that show the frequency response of distributed amplifier 300 (FIG. 3). Curves 508 show a bandwidth at −3 dB of 68 GHz and robust performance across process, voltage and temperature variation corners as represented by each of curves 508. In some embodiments, curves 508 represent distributed amplifier 300 driving large capacitive loads of 600 femtoFarads (fF) from a large analog-to-digital converter array. In some embodiments, distributed amplifier 300 achieves low power and lower noise when compared to conventional multi-stage amplifiers.

Figure 6:
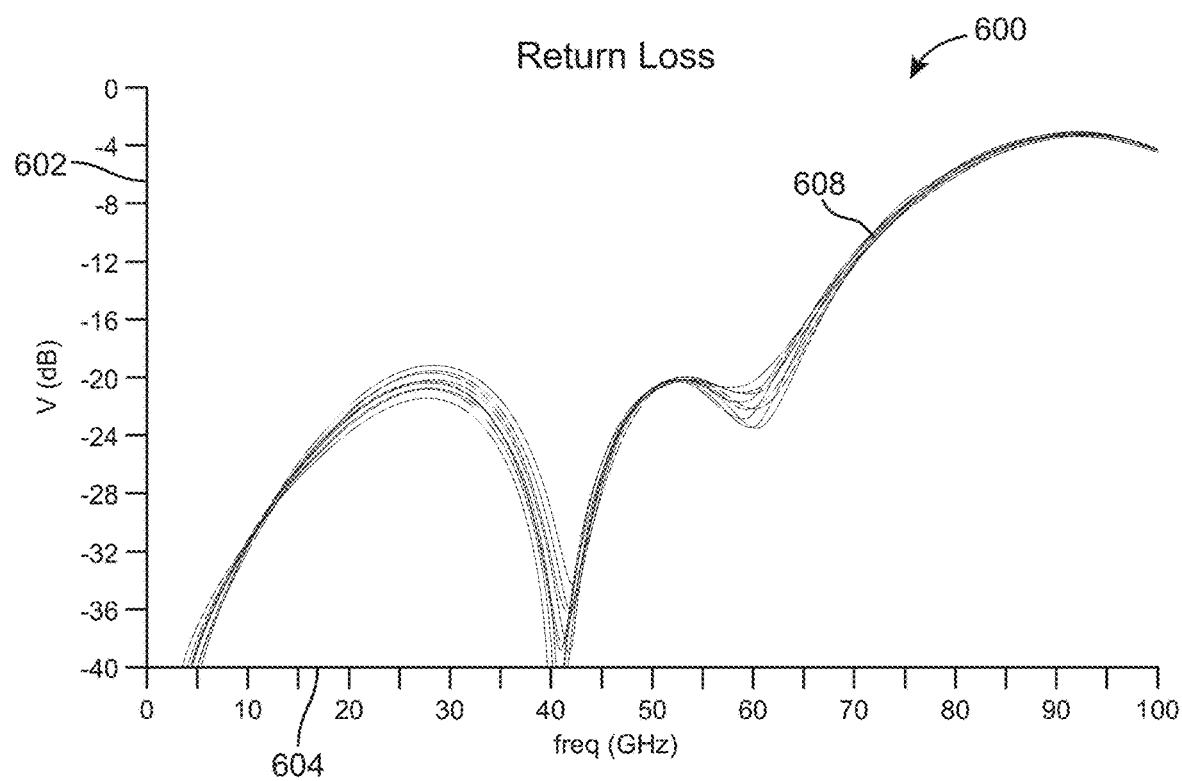
FIG. 6 is a graph showing $S_{11}$ in dB versus frequency for an output signal of the distributed amplifier illustrated in FIG. 3 according to one or more embodiments.

With reference to FIG. 6, a graph 600 includes a Y-axis 602 representing the $S_{11}$, i.e. input return loss, in dB and an X-axis 604 representing frequency. Graph 600 includes curves 608 that show the return loss of distributed amplifier 300 (FIG. 3) is less than −16 dB. Robust performance across process variation and temperature corners as represented by curves 608 for the absolute value of $S_{11}$ is shown for frequencies up to 65 GHz. In some embodiments, curves 608 represent distributed amplifier 300 driving large capacitive loads of 600 femtoFarads (fF) from a large analog-to-digital converter array. The resistance, capacitance and inductance values given throughout the disclosure are exemplary only. Other values can be utilized depending on design criteria.

It should be noted that certain passages of this disclosure can reference terms such as "first" and "second" in connection with devices or operations for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a stand-alone device or, in some embodiments, on multiple devices in separate packages or multichip modules. In addition, the systems and methods described above can utilize different capacitance, resistance, and inductance values than those given herein depending on application requirements and design criteria. Further, certain components may be coupled together with intervening components (e.g., buffers, inverters, pads, passive components, etc.) provided there between.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A device comprising:
   a plurality of cells comprising a first cell and a second cell;
   a plurality of transmission lines comprising a first line and a second line, wherein the first cell is coupled to the first line and the second cell is coupled to the second line, wherein the first line is configured to provide a first delay related to a delay between the first cell and the second cell; and
   a summer comprising a first input coupled to the first line and second input coupled to the second line, wherein the summer is configured to provide an output signal, wherein the summer comprises a first transistor having a transconductance related to an inverse of inductance associated with the first line divided by capacitance associated with the first line.

2. The device of claim 1, wherein the first cell is configured to provide a first signal to the first line and the second cell is configured to provide a second signal to the second line.

3. The device of claim 2, wherein the output signal is a summed signal comprising a combination of the first signal and the second signal.

4. The device of claim 1, further comprising an output network, wherein the output network is configured to perform inductive peaking.

5. The device of claim 1, wherein the transconductance is related to an inverse of a square root of the inductance associated with the first line divided by the capacitance associated with the first line.

6. The device of claim 1, wherein the first line includes a network comprising a pair of capacitors coupled to ground and an inductor coupled between the pair of capacitors.

7. The device of claim 1, wherein the first line includes a network comprising a pair of capacitors coupled to ground and an inductor coupled between the pair of the capacitors and wherein the transconductance is related to an inverse of a square root of the inductance of the inductor divided by the capacitance of the pair of the capacitors.

8. The device of claim 1, further comprising:
   an output network coupled to the summer.

9. The device of claim 8, wherein the output network comprises a network configured to perform inductive peaking.

10. An amplifier in an integrated circuit, the amplifier comprising:
    a first network comprising a transmission line and a plurality of cells, each of the cells having a cell input coupled to a node on the transmission line;
    a plurality of circuits, each of the circuits being coupled to a respective cell of the cells, wherein at least one of the circuits comprises a second network comprising a capacitance and an inductance; and
    a summer coupled to the circuits, wherein the summer is configured to provide an output signal, wherein the summer comprises at least one transistor have a transconductance inversely related to a quotient of the inductance and the capacitance.

11. The amplifier of claim 10, further comprising:
    an output network configured to receive the output signal from the summer.

12. The amplifier of claim 11, wherein the output network is configured to perform inductive peaking.

13. The amplifier of claim 10, wherein the second network comprises a capacitor and an inductor and is configured to provide a first delay related to a delay between the cells.

14. The amplifier of claim 10, wherein the transconductance is inversely related to a square root of the quotient of the inductance and the capacitance.

15. The amplifier of claim 10, wherein one of the circuits is a direct connection between one of the cells and an input of the summer.

16. The amplifier of claim 10, wherein the summer comprises at least two transistors and first inputs of the transistors are coupled to respective circuits, second inputs of the transistors are coupled together, and gates of the transistors are coupled together.

17. A method of providing an output signal, the method comprising:
    providing a first signal at a first node on an input transmission line to a first cell;
    amplifying the first signal to provide a first amplified signal;
    providing a second signal at a second node on the input transmission line to a second cell, the second signal being delayed by a first delay with respect to the first signal;
    amplifying the second signal to provide a second amplified signal;
    delaying the first amplified signal with respect to the second amplified signal to compensate for the first delay;
    summing the first amplified signal and the second amplified signal to provide the output signal; and
    providing the output signal to an output network configured to perform series peaking, shunt-series peaking, or Tcoil peaking.

18. The method of claim 17, wherein the summing uses a transistor having a transconductance related to a quotient of inductance of an inductor and capacitance of a capacitor used to delay the first signal.

19. The method of claim 18, wherein the
    output network is configured to perform Tcoil peaking.

20. The method of claim 17, further comprising:
providing a third signal at a third node on the input transmission line to a third cell, the third signal being delayed by a second delay with respect to the first signal;
wherein delaying the first amplified signal with respect to the second amplified signal comprises delaying the second amplified signal and the first amplified signal to compensate for the second delay; and
wherein summing the first amplified signal and the second amplified signal comprising summing the first amplified signal, the second amplified signal and a third amplified signal to provide the output signal.

* * * * *